(12) United States Patent
Ang et al.

(10) Patent No.: US 6,611,024 B2
(45) Date of Patent: Aug. 26, 2003

(54) METHOD OF FORMING PID PROTECTION DIODE FOR SOI WAFER

(75) Inventors: Ting Cheong Ang, Singapore (SG); Shyue Fong Quek, Petaling Jaya (MY); Sang Yee Loong, Singapore (SG); Jun Song, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 9 days.

(21) Appl. No.: 09/946,981

(22) Filed: Sep. 6, 2001

(65) Prior Publication Data

US 2002/0022328 A1 Feb. 21, 2002

Related U.S. Application Data

(62) Division of application No. 09/614,558, filed on Jul. 12, 2000, now Pat. No. 6,303,414.

(51) Int. Cl.[7] ............... H01L 27/01; H01L 31/0392; H01L 21/8234; H01L 21/76
(52) U.S. Cl. ............ 257/350; 257/355; 257/357; 438/152; 438/237; 438/406; 438/407
(58) Field of Search ................... 257/350, 357, 257/355, 356; 438/237, 406, 407, 152

(56) References Cited

U.S. PATENT DOCUMENTS

| | | | | |
|---|---|---|---|---|
| 5,430,318 A | * | 7/1995 | Hsu ........................ 257/370 |
| 5,567,968 A | | 10/1996 | Tsuruta et al. ............. 257/356 |
| 5,610,083 A | | 3/1997 | Chan et al. ................. 437/21 |
| 5,751,041 A | | 5/1998 | Suzuki et al. .............. 257/357 |
| 5,786,616 A | | 7/1998 | Fukumoto et al. .......... 257/358 |
| 5,923,067 A | * | 7/1999 | Voldman .................... 257/349 |
| 6,121,659 A | * | 9/2000 | Christensen et al. ........ 257/347 |
| 6,121,661 A | * | 9/2000 | Assaderaghi et al. ....... 257/355 |
| 6,124,615 A | * | 9/2000 | Lee ............................ 257/349 |
| 6,406,948 B1 | * | 6/2002 | Jun et al. ................... 438/152 |
| 6,407,427 B1 | * | 6/2002 | Oh ............................. 257/347 |
| 6,407,429 B1 | * | 6/2002 | Ko et al. .................... 257/350 |
| 6,436,850 B1 | * | 8/2002 | Morales ..................... 438/781 |
| 6,452,234 B1 | * | 9/2002 | Mahanpour ................. 257/349 |

OTHER PUBLICATIONS

Wolf et al., "Chemical Vapor Deposition of Amorphous and Polycrystalline Films," Silicon Processing for the VLSI Era —vol. 1: Process Technology, Lattice Press, 1986, pp. 182–191.*
Wolf Ph.D, Stanley "Contact Technology and Local Interconnects for VLSI," Silicon Processing for the VLSI Era —vol. 2: Process Integration, Lattice Press, 1990, 144–147.*
Wolf Ph.D, Stanley, "Multilevel–Interconnect Technology for VLSI and ULSI," Silicon Processing for the VLSI Era —vol. 2: Process Integration, Lattice Press, 1990, pp. 192–194.*

* cited by examiner

Primary Examiner—Stephen D. Meier
Assistant Examiner—Toniae M. Thomas
(74) Attorney, Agent, or Firm—George O. Saile; Rosemary L. S. Pike

(57) ABSTRACT

An integrated microelectronics semiconductor circuit fabricated on a silicon-on-insulator (SOI) type substrate can be protected from unwanted current surges and excessive heat buildup during fabrication by means of a heat-dissipating, protective plasma-induced-damage (PID) diode. The present invention fabricates such a protective diode as a part of the overall scheme in which the transistor devices are formed.

8 Claims, 5 Drawing Sheets

METHOD OF FORMING PID PROTECTION DIODE FOR SOI WAFER

This is a division of patent application Ser. No. 09/614,558, filing date Jul. 12, 2000, Method Of Forming Pid Protection Diode For Soi Wafer, assigned to the same assignee as the present invention and issued as U.S. Pat. No. 6,303,414.

BACKGROUND OF THE INVENTION

1. Field of the Invention

This invention relates to a semiconductor integrated microelectronic circuit device having a silicon-on-insulator (SOI) structure.

2. Description of the Related Art

SOI (silicon-on-insulator) technology is the fabrication of integrated semiconductor microelectronics circuitry on a three-layer substrate consisting of an upper layer of monocrystalline silicon, a layer of insulating material, usually an oxide of silicon, and an underlying layer of monocrystalline silicon. Although there are several methods for forming the SOI structure, wafer bonding or the SIMOX (separation by implanted oxygen) technique, which forms a buried oxide layer by driving oxygen ions into the silicon substrate, is commonly used. The circuitry is then primarily fabricated in the upper silicon layer, wherein it is substantially electrically isolated from the underlying silicon layer. SOI technology has become important precisely because it has the virtue of providing such degrees of isolation between circuit elements.

The very isolation of the thin upper silicon layer from the more substantial lower layer presents the possibility of unwanted surge currents in signal input lines, such as those caused by electrostatic discharges and the like, damaging circuit elements. One accepted way of ameliorating the effects of such currents is to provide the input line with a protective diode circuit to channel current surges away from the affected regions. Tsuruta et al. (U.S. Pat. No. 5,567,968) teach the formation of a protective diode structure that allows the passage of high currents in MOSFET circuitry fabricated in SOI layers. They teach a particular diode structure wherein a p-type semiconductor layer and an n-type semiconductor layer are electrically connected by a buried semiconductor layer to form a vertically disposed pn-junction. The diode so formed is then itself connected electrically to an adjacent MOSFET and thereby functions as an electrostatic discharge protection element. Suzuki et al. (U.S. Pat. No. 5,751,041) teach a method of protecting a CMOS inverter circuit formed in an SOI substrate by use of an np-diode connected between the signal input line and ground. They teach the formation of a second diffusion layer of a conductivity type that is the same as but of a higher concentration than that of the substrate, so as to circumscribe the extent of the depletion region and eliminate unwanted leakage currents. Fukumoto et al. (U.S. Pat. No. 5,786,616) teach the formation of a diode type circuit that protects against two types of surges: a surge between the signal input terminal and a ground terminal, and a surge between a signal input terminal and a power supply terminal, with the latter surge protection being the novel element of the invention. According to the method taught by Fukumoto et al., the power supply to signal input surges are protected against by a parasitic diode element formed between a resistor diffusion region and the underlying semiconductor substrate.

As can be seen from the above, the use of diode circuitry of one form or another to protect integrated SOI microelectronic circuits is an accepted part of the present art of fabricating such circuitry. Such protection, however, is not only needed when the SOI circuits are in actual use, it is also needed to protect the SOI circuitry from hazards that arise during its fabrication. In particular, the extensive use of plasmas in such fabrication processes as plasma assisted film depositions and etching causes the accumulation of charge deposits on conductive surfaces. If these charge excesses were not removed, they would produce potential differences across gate oxides which would be sufficient to cause their breakdown and damage or destroy transistors.

Another cause of circuit damage during SOI microelectronics fabrications as well as loss of circuit reliability is excessive heat buildup due to poor heat conduction and dissipation. The reduced size of modern microelectronic circuitry requires the use of low-k (low dielectric constant) materials to serve as interlayer dielectrics and insulating layers. Low-k materials, such as CORAL, manufactured by Novellus Corp., Black Diamond, manufactured by Applied Materials Corp., organic films from the Schumacher Corp. and various carbon-containing films, allow the formation of closely packed circuit elements without the attendant inter-element parasitic capacitances that would be associated with other dielectric materials. Unfortunately, such low-k dielectric materials also have low thermal conductivities, typically 0.24–0.37 W/k.m vs. 1.2 W/k.m for $SiO_2$, which allows localized heat buildup in the fabrication. None of the methods discussed above address the problem of heat buildup or its reduction. The present invention addresses the heat dissipation problem simultaneously with the excess charge reduction problem by teaching a method of forming a PID protective diode that produces a structure capable of eliminating or significantly reducing both problems and does so efficiently, cost-effectively and in a manner that smoothly integrates its formation into the overall circuit fabrication scheme.

SUMMARY OF THE INVENTION is an object of the present invention to teach a method of forming a "plasma-induced-damage" (PID) diode protective circuit for an SOI integrated microelectronic fabrication, such as a fabrication containing an arbitrary array of conductively interconnected nMOS and pMOS transistors disposed in single or multiple levels of integration.

It is yet another object of the present invention to teach a method of fabricating a PID diode protective circuit for an SOI integrated microelectronics fabrication that enhances the dissipation of heat produced during fabrication processes.

It is yet a further object of the present invention to teach a PID protective diode circuit fabrication method that is accomplished efficiently, cost-effectively and in a manner that smoothly integrates the diode formation into the overall fabrication scheme.

The objects of the present invention are achieved by a novel PID protective diode structure that conducts excess charge away from active portions of circuitry formed in the upper silicon layer of the SOI substrate, through a low resistance diode circuit, to the lowest silicon layer of the SOI substrate and, at the same time, conducts excess heat away from said portions of the circuitry, similarly conveying such heat to the lower silicon layer of the SOI substrate wherein it can be dissipated without damage to the fabricated circuitry. This is achieved by conductively connecting said diode to metal layers and structures, formed in various shapes over the various levels containing active portions of the circuitry, said layers and structures serving both as charge collectors and heat sinks and, thereby, conveying both charge and heat, through inter-level vias, directly to the lowest silicon layer of the SOI substrate.

The objects of the present invention are further achieved efficiently and cost-effectively by making use of an alignment opening formed during the fabrication process through which to form the diode in the lowest silicon layer of the SOI substrate.

BRIEF DESCRIPTION OF THE DRAWINGS

FIG. 1 shows a schematic cross-sectional view of a lightly doped p-type SOI substrate on which a photoresist film has been patterned for the production of shallow trench isolation (STI) regions that will separate active elements of the circuitry.

FIG. 2 shows a schematic cross sectional view of the SOI substrate of FIG. 1 subsequent to the formation of the STI regions and the removal of the photoresist film.

FIG. 3 shows a schematic cross-sectional view of the SOI substrate of FIG. 2 on which a second photoresist film has been deposited and patterned for the formation of an alignment opening.

FIG. 4 shows a schematic cross-sectional view of the SOI substrate of FIG. 3 subsequent to the etching back of the previously patterned alignment opening.

FIG. 5 shows a schematic cross-sectional view of the SOI substrate of FIG. 4 on which a third photoresist film has been patterned to allow the implantation of n type impurities into the upper silicon layer and into the portion of the lower silicon substrate exposed by the previous etching process depicted in FIG. 4, producing therein an n- well structure that will form the PID protective diode.

FIG. 6 shows a schematic cross-sectional view of the SOI substrate of FIG. 5 subsequent to the formation of gate electrodes and polysilicon spacers. The detailed structure of the electrodes is not critical to the present invention and is not shown herein.

FIG. 7 shows a schematic cross-sectional view of the SOI substrate of FIG. 6 subsequent to the deposition and patterning of a fourth photoresist film to allow implantation of n+ source/drain regions in the pMOS structures and to form an n+ well within the already implanted n- well of the PID protective diode formed in the underlying silicon substrate as shown in FIG. 5.

FIG. 8 shows a schematic cross-sectional view of the SOI substrate of FIG. 7 subsequent to the implantation of a high density of p-type impurities to form p+ source/drain regions for the nMOS structures and to selectively form salicide contact regions. The resulting SOI fabrication is then covered with an interlayer dielectric (ILD).

FIG. 9 shows a schematic cross-sectional view of the SOI substrate showing the formation of contacts to the salicides and the PID protection diode through the ILD.

FIGS. 10 A, B, C and D show a common side view (10A) and two different top views (B and C) of the fabrication of FIG. 9, on which has now been formed a layer of metal to act as both a heat sink and charge collector. The figures also show a top view of the conducting contacts that arise from a typical transistor in the SOI substrate beneath the ILD and are separated from the metal layer that connects to the PID protective diode. FIGS. 10 B and C differ only in the shape of this metal layer, said shapes being only two among the many that could be formed as appropriate to the nature of the underlying circuitry. FIG. 10 D Shows a top view of a slightly different circuit configuration, wherein an entire transistor array would be located beneath an appropriately shaped opening in the metal layer.

DESCRIPTION OF THE PREFERRED EMBODIMENT

Figure 1:
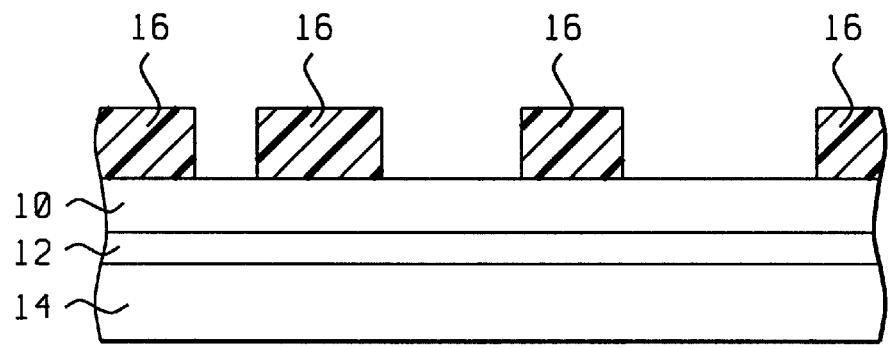
FIGS. 1–10 show, in schematic fashion, a sequence of processes leading to the fabrication of a typical microelectronics integrated circuit on an SOI substrate, incorporating a PID protective diode that eliminates excess charge and dissipates heat.

The fabrication method by which a protective PID diode circuit is incorporated into an SOI microelectronics integrated circuit will now be described with reference to the above figures. Referring first to FIG. 1, there is shown a schematic cross-sectional diagram of a three-layered SOI (silicon-on-insulator) substrate, comprising an upper monocrystalline silicon layer (10), an insulating layer (12), which can be a layer of silicon oxide, and a lower silicon layer (14). The upper and lower silicon layers are lightly doped with p-type conduction impurities in this particular example. The SOI substrate may be formed by wafer bonding, the SIMOX method or by other methods known to practitioners of the art. The upper surface of the upper silicon layer (10) is shown covered with a first layer of photoresist (16) that has been patterned for the formation of shallow trench isolation (STI) regions. Although methods of forming STI regions are known to practitioners of the art, the method of the present invention etches the upper silicon layer (10) through the mask, fills the trenches so produced with silicon oxide or silicon oxynitride (18) and then planarizes the resulting formation.

Figure 2:
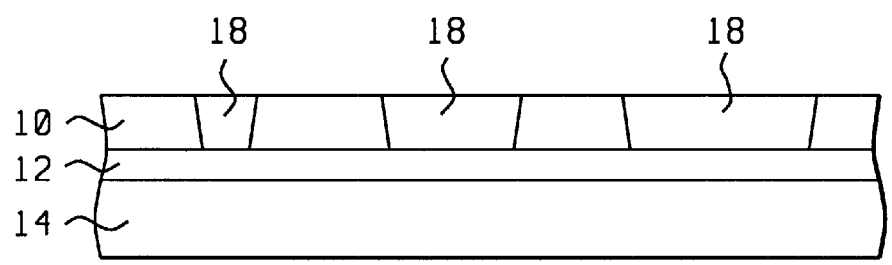

Referring next to FIG. 2, there is shown the SOI substrate of FIG. 1 subsequent to the formation of the shallow trench isolation (STI) regions (18), the removal of the first photoresist layer and the planarization of the fabrication so produced.

Figure 3:
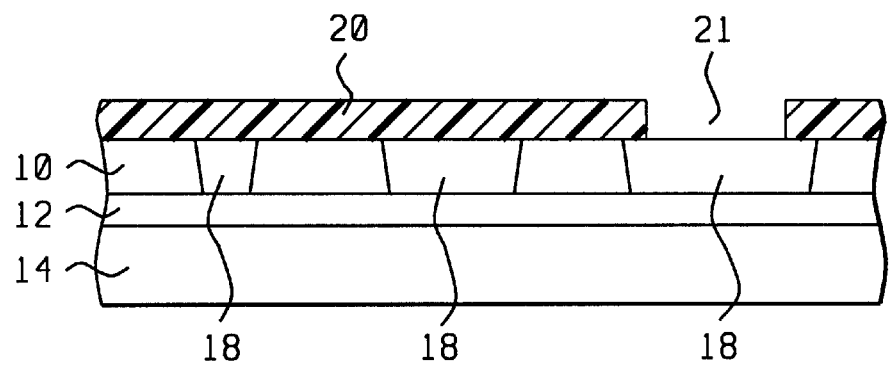

Referring next to FIG. 3, there is shown the SOI substrate of FIG. 2 with the formation thereon of a second photoresist layer (20), patterned at (21) to allow the formation of an opening through the STI oxide (18) and the SOI oxide layer (12) (eg. by a $C_4F_8$ etch) to expose the lower silicon layer (14). The PID protection diode will ultimately be formed in the lower silicon layer (14), which layer does not contain the integrated microelectronics circuitry and, therefore, allows the formation of a larger diode appropriate to the magnitude of the discharges to be protected against.

Figure 4:
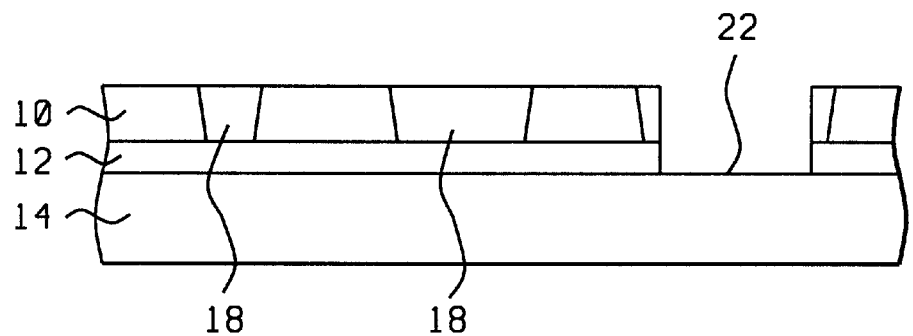

Referring next to FIG. 4, there is shown the SOI substrate of FIG. 3 subsequent to the etching back of the STI (18) and SOI (12) oxides to produce an opening (22) to the lower silicon layer (14). The opening (22) serves both as an alignment opening for mask alignment and repair and as entry to the lower silicon layer (14) for the subsequent PID diode formation. The second photoresist layer ((20) in FIG. 3) has been removed.

Figure 5:
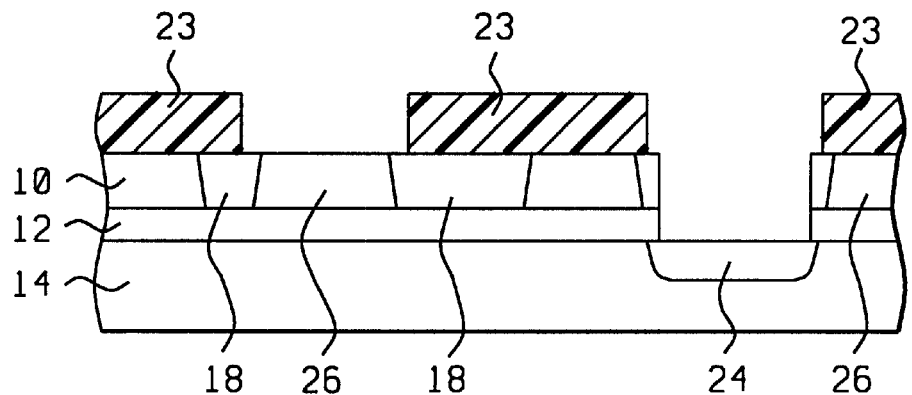

Referring next to FIG. 5, there is shown the fabrication of FIG. 4 with the addition of a third photoresist layer (23) which has been patterned to allow the formation of an n-type well in the silicon substrate at (24), which will be the PID protection diode.

Figure 6:
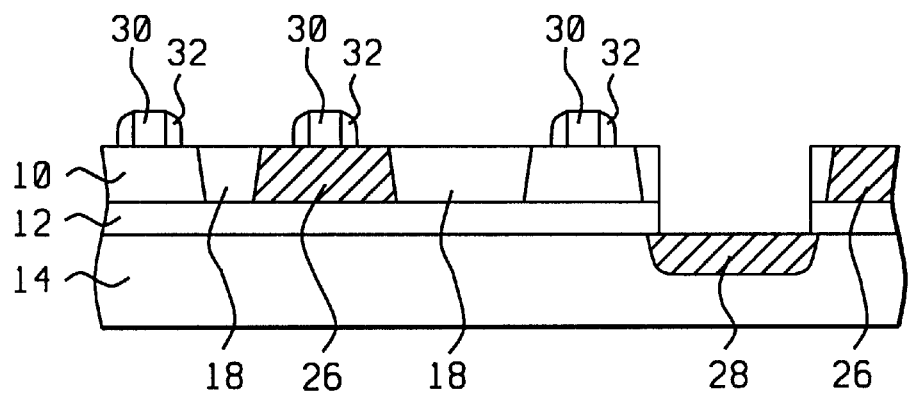

Referring next to FIG. 6, there is shown the fabrication of FIG. 5 subsequent to the removal of the third photoresist layer and the n-type doping that has now produced the substrate well (28) of the PID diode and other n-type doped regions (shown crosshatched). A succession of additional process steps (not shown) has also formed gate stacks (30) and sidewall spacers (32) on the upper silicon layer.

Figure 7:
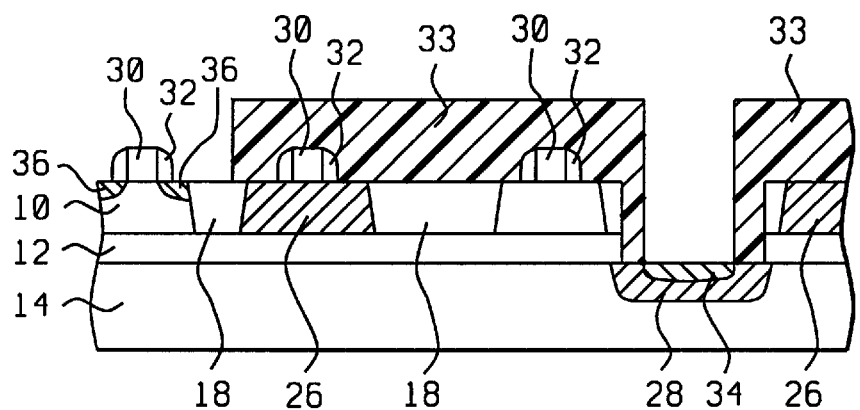

Referring next to FIG. 7, there is shown the fabrication of FIG. 6, subsequent to the patterning of a fourth photoresist layer (33) to allow the implant of a higher density of n-type ions so as to form an n+ region in the low density n-type substrate well (34) and to form n+ source and drain regions in selected MOS structures (36) of the microelectronics fabrication (shown heavily crosshatched). The n+ doping of the PID diode well allows a low-resistance contact to be subsequently formed on the PID diode.

Figure 8:
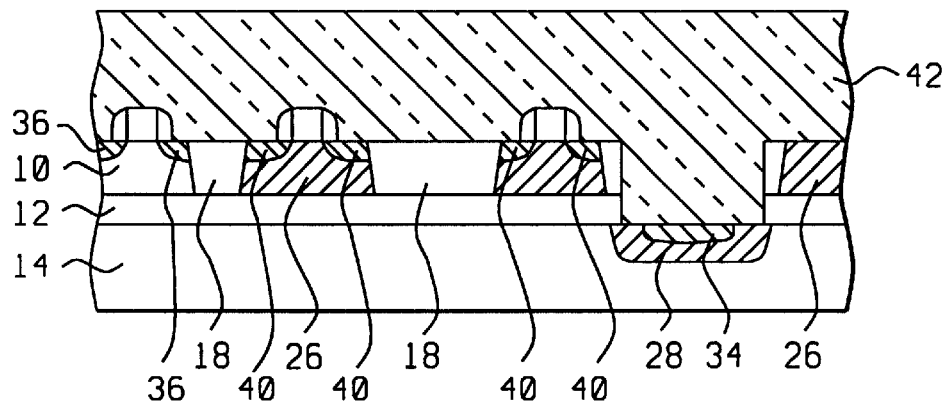

Referring next to FIG. 8, there is shown the fabrication of FIG. 7 with the additional formation of silicided p+ implanted source/drain regions that have been formed, either on all S/D regions or selectively, by the salicide process (40) (shown oppositely crosshatched to the n-regions). The entire fabrication has then been covered by an interlayer dielectric (ILD) (42), which can be formed of sub-atmospheric BPSG (SABPSG), high density plasma deposited USG or FSG, carbon doped films or oxides, all deposited to a thickness of between 6,000 and 20,000 angstroms.

Figure 9:
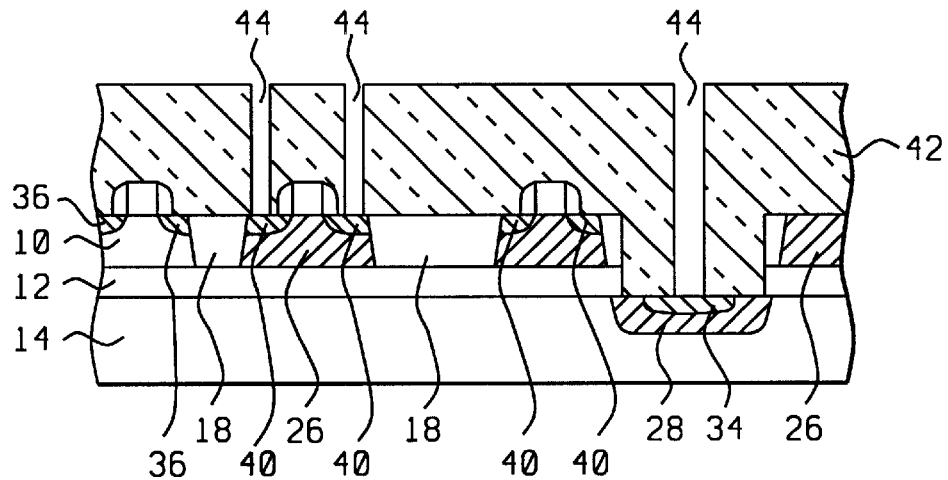

Referring, now, to FIG. 9, there is shown the fabrication of FIG. 8 with the additional formation of contacts (44) through the ILD, to selected circuit elements and to the PID diode, thereby allowing the PID diode to perform its protective role.

FIGS. 10, A, B, C and D, show the formation of a metal layer over the fabrication of FIG. 9, said metal layer being conductively connected to the PID protective diode beneath it. FIG. 10A is a side view of the fabrication of FIG. 9, showing the metal layer (50). The PID diode is connected to this layer by its contact (44a) at (52). The emerging contacts (44b) from an exemplar circuit element beneath the ILD are connected to metal pieces, such as tungsten pieces, that do not touch the metal layer, but are separated from it by a distance that depends on the width of those pieces.

Figure 10A:
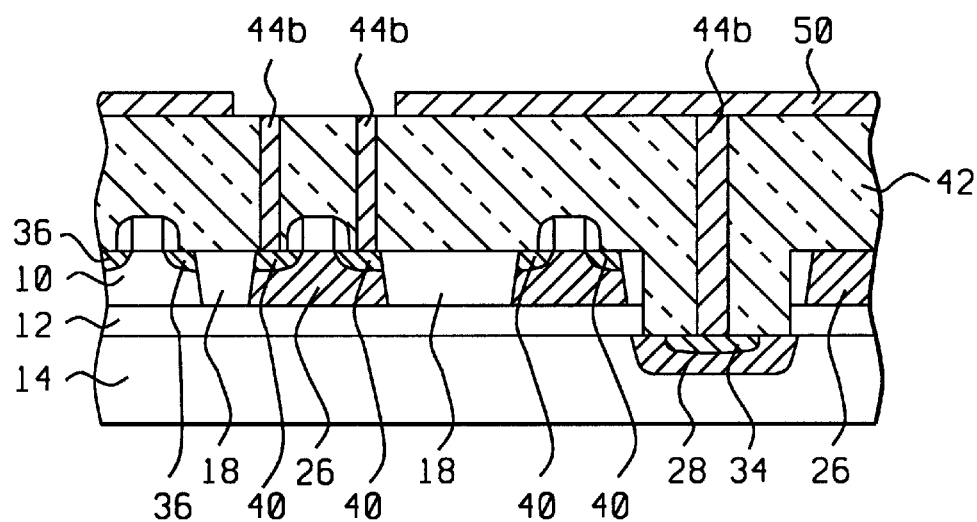
Figure 10B:
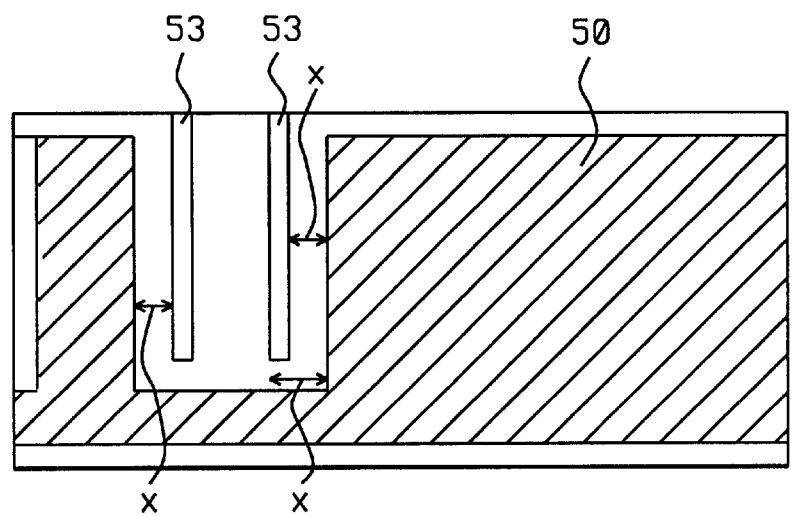

FIG. 10B is a schematic top view of the fabrication of FIG. 10A. The metal pieces (53) connected to the circuit element are shown separated from the metal layer (50) by at least an amount "X," said amount depending on the width of the metal pieces and being generally equal to or greater than the width of the metal pieces (53). As an example:

| Metal Width (microns): | 0.19 | 0.24 | 0.36 |
|---|---|---|---|
| Spacing (microns): | >0.20 | >0.24 | >0.38 |

Additional metal layers may be formed over additional levels of circuit integration, passing conducting leads to the PID protective diode through vias formed in the appropriate ILD layers.

Figure 10C:
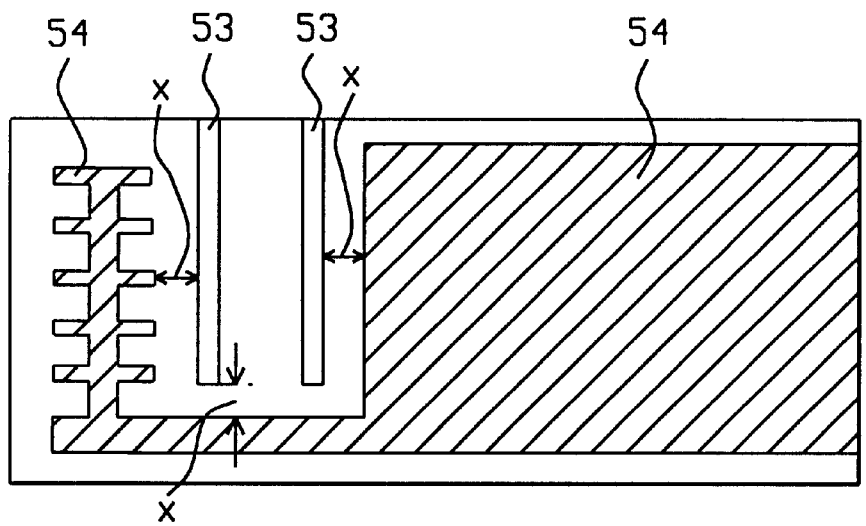

FIG. 10C shows a metal layer of a different shape (54), still serving the same purpose as the layer in FIG. 10B. In this particular shape, part of the layer has an antenna-like formation, allow better heat dissipation as might be appropriate to the particular fabrication steps or circuitry formed below. The spacing, X, between the layer and the metal pieces still obeys the same rules.

Figure 10D:
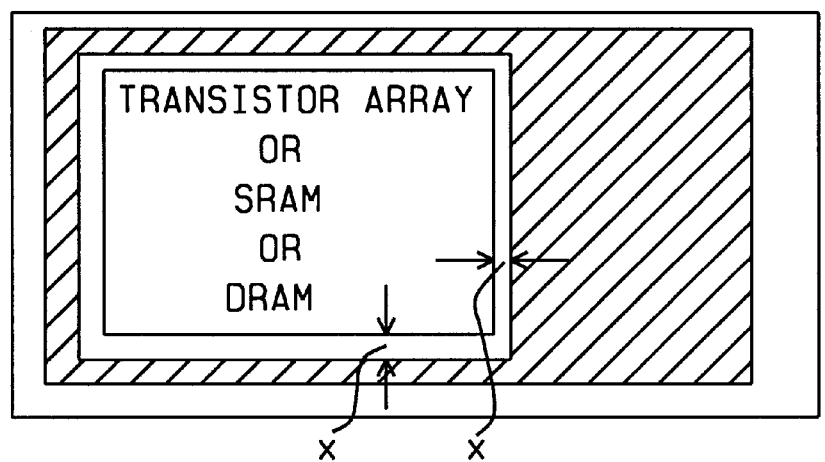

FIG. 10D shows a metal layer shaped to accommodate a transistor array, SRAM or DRAM beneath it. The shapes of the layer depicted in B, C and D are by no means exhaustive.

As is understood by a person skilled in the art, the preferred embodiment of the present invention is illustrative of the present invention rather than being limiting of the present invention. Revisions and modifications may be made to methods, processes, materials, structures, and dimensions through which is formed a PID protective diode for an SOI wafer, while still providing a PID protective diode for an SOI wafer formed in accord with the present invention as defined by the appended claims.

What is claimed is:

1. An integrated semiconductor microelectronics circuit formed on an SOI substrate and protected by a heat-dissipating PID diode, comprising:

an SOI substrate, said substrate comprising upper and lower layers of silicon, with an insulating layer formed therebetween;

a plurality of nMOS and pMOS type transistor devices with silicided source/drain and gate electrode contacts, formed in the upper silicon layer of said SOI substrate;

a PID protective diode formed as a junction in the lower silicon layer of said SOI substrate;

an ILD formed over said circuit, through which pass conducting contacts to the transistor devices and PID protective diode.

a heat and charge dissipating metal layer formed over the ILD layer, said metal layer being in electrical contact with the contact from the PID diode, but not being in electrical contact with the contacts of said transistors.

2. The circuit of claim 1, wherein the SOI substrate has been formed by the SIMOX method or by a method of wafer bonding.

3. The circuit of claim 1, wherein the upper and lower silicon layers of the SOI substrate are doped with a low density of p-type ions.

4. The circuit of claim 3, wherein the PID diode is an np type diode having a low density of n-type ions implanted in the lower p-type silicon layer of the SOI substrate, said ions being implanted to a density of between 5E13 and 1E15 ions per cubic centimeter.

5. The circuit of claim 1, wherein the contacts through the ILD to the PID diode and silicided regions of the MOS devices are formed of tungsten.

6. The circuit of claim 1, wherein the metal layer covering the ILD is shaped such that it optimally collects excess charges and dissipates heat generated by subsequent fabrication processes, such shapes being chosen from the group consisting of perimeter pieces, fingers and antenna shaped projections, and such shapes being formed so as to maintain a certain minimum distance from any nearby conductive contacts to the circuitry below.

7. The circuit of claim 1, wherein the spacing between the metal layer and any nearby conductive contacts is at least the width of those conductive contacts.

8. The circuit of claim 1, further including a plurality of levels of microelectronic circuitry, said levels being covered by conducting layers which are connected, through vias, to said PID protective diode.

* * * * *